United States Patent
Huang et al.

(10) Patent No.: US 7,786,552 B2
(45) Date of Patent: Aug. 31, 2010

(54) SEMICONDUCTOR DEVICE HAVING HYDROGEN-CONTAINING LAYER

(75) Inventors: Tsung-Hsun Huang, Chungho (TW); Kuo-Yin Lin, Jhubei (TW); Chung-Yi Yu, Hsin-chu (TW); Chih-Ta Wu, Hsinchu (TW); Chia-Shiung Tsai, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 448 days.

(21) Appl. No.: 11/149,575

(22) Filed: Jun. 10, 2005

(65) Prior Publication Data
US 2006/0278959 A1 Dec. 14, 2006

(51) Int. Cl.
*H01L 23/58* (2006.01)
(52) U.S. Cl. .............. 257/637; 257/639; 257/640; 257/649; 257/E23.145; 257/E21.29
(58) Field of Classification Search .......... 257/637, 257/639–640, 646, 649, E23.145, E21.29
See application file for complete search history.

(56) References Cited

U.S. PATENT DOCUMENTS

| | | | |
|---|---|---|---|
| 7,253,105 B2 * | 8/2007 | Dimitrakopoulos et al. | 438/674 |
| 2003/0096438 A1 | 5/2003 | Lee | 438/29 |
| 2004/0178429 A1 | 9/2004 | Tanaka | 257/288 |
| 2004/0195659 A1 * | 10/2004 | Grill et al. | 257/632 |
| 2005/0184397 A1 * | 8/2005 | Gates et al. | 257/774 |

FOREIGN PATENT DOCUMENTS

| CN | 1531112 A | 3/2004 |
|---|---|---|
| GB | 2370 416 A | 6/2002 |

* cited by examiner

*Primary Examiner*—Thanh Nguyen
(74) *Attorney, Agent, or Firm*—K&L Gates LLP

(57) ABSTRACT

A method for reducing leakage current in a semiconductor structure is disclosed. One or more dielectric layers are formed on a semiconductor substrate, on which at least one device is constructed. A hydrogen-containing layer is formed over the dielectric layers. A silicon nitride passivation layer covers the dielectric layers and the hydrogen-containing layer. The hydrogen atoms of the hydrogen-containing layer are introduced into the dielectric layers without being blocked by the silicon nitride layer, thereby reducing leakage current therein.

15 Claims, 2 Drawing Sheets

SEMICONDUCTOR DEVICE HAVING HYDROGEN-CONTAINING LAYER

BACKGROUND

The present invention relates generally to an integrated circuit (IC) design, and more particularly to a method for reducing leakage current in an IC chip.

In semiconductor technology, it is important to protect devices from mechanical damage and environmental contamination which may affect the proper operation of the devices. A conventional method commonly used for providing such protection is to directly coat the devices with a thin film of silicon nitride. Silicon nitride is commonly used since it provides resistance against wear and serves as a good barrier to sodium ions, which can penetrate into oxide layers of an IC chip and destroy their insulating properties. This layer of passivation silicon nitride is usually deposited at relatively low temperatures using a technique known as plasma enhanced chemical vapor deposition (PECVD). Under certain circumstances, a nitride layer alone is not enough for protecting its underlying devices. For instance, in physiological saline solution, under an applied electric field created from active components on an IC chip, the property of silicon nitride rapidly degrades. For this reason, in conventional methods, laminated layers of silicon oxide and silicon nitride may be used, wherein the silicon oxide can provide insulation to keep the current flow from the silicon nitride, while allowing the silicon nitride to protect the silicon oxide from sodium ions.

After formation of the silicon nitride and silicon oxide, a hydrogen-forming gas-annealing process is performed for driving hydrogen atoms into inter-metal dielectric layers of the IC chip to fix dangling bonds therein, thereby reducing their leakage current. However, the layer of silicon nitride acts as a barrier against the hydrogen diffusion, thereby lessening the effectiveness of the hydrogen-forming gas annealing process. For this reason, multiple stages of hydrogen-forming gas annealing process are often required in order to reduce the leakage current to an acceptable level. The multiple-stage annealing process is time-consuming and costly.

Therefore, desirable in the art of semiconductor manufacturing are methods for effectively and efficiently fabricating a semiconductor device with reduced leakage current.

SUMMARY

The present invention discloses a method for reducing leakage current in a semiconductor structure. In one embodiment, a semiconductor substrate, on which at least one device is constructed, is provided. One or more dielectric layers are formed on the semiconductor substrate. A hydrogen-containing layer is formed over the dielectric layers. A silicon nitride passivation layer covers the dielectric layers and the hydrogen-containing layer. The hydrogen atoms of the hydrogen-containing layer are then introduced into the dielectric layers.

The construction and method of operation of the invention, however, together with additional objects and advantages thereof will be best understood from the following description of specific embodiments when read in connection with the accompanying drawings.

DESCRIPTION

Figure 1:
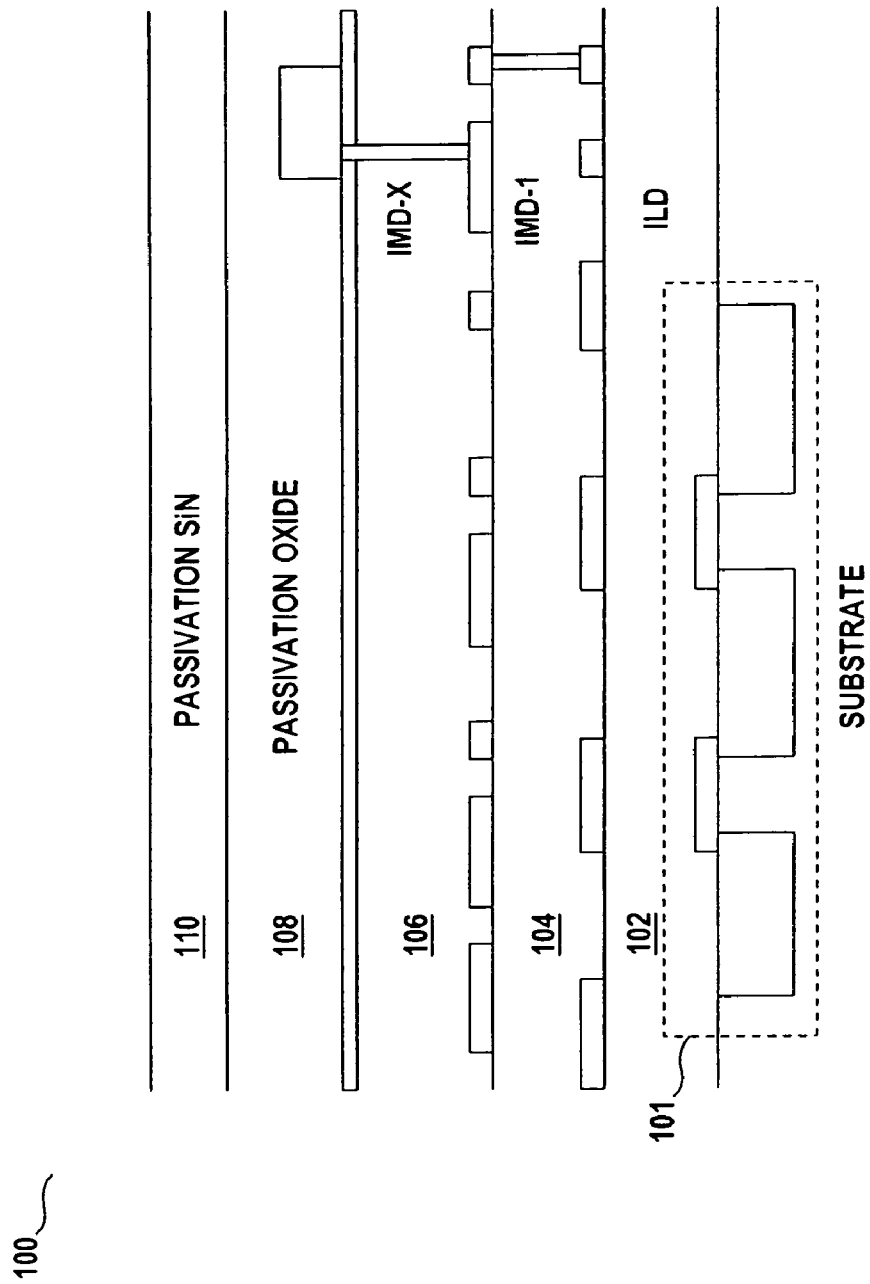
FIG. 1 illustrates a cross section of a semiconductor device fabricated by a conventional method.

FIG. 1 illustrates a cross section 100 of a semiconductor device 101 fabricated by a conventional method. Multiple layers of dielectric are typically formed on top of the semiconductor device 101. An interlayer dielectric (ILD) 102 is deposited on a semiconductor substrate. The ILD 102 is then covered by several layers of inter-metal dielectric (IMD) such as IMDs 104 and 106 where the contacts therein may be coupled together to provide connection between various metal layers. A layer of passivation silicon oxide 108 covers the IMD 106 to provide a layer of insulation. To protect the semiconductor device 101, a layer of passivation silicon nitride (SiN) 110 is overlaid above the layer of passivation oxide 108 and the IMDs 104 and 106. The passivation SiN 110 provides resistance to wear and serves as a barrier against sodium ions, which can penetrate into the passivation oxide 108 and IMDs 104 and 106, thereby destroying their insulating properties. A hydrogen-forming gas annealing process is performed to reduce the leakage current in the IMDs 104 and 106. Generally, several stages of hydrogen-forming gas annealing are required before the leakage current is reduced to an acceptable level.

The hydrogen-forming gas annealing process can be ineffective and inefficient, since the passivation SiN is a barrier to hydrogen diffusion that is desired for reducing the leakage current in an IC chip.

Figure 2:
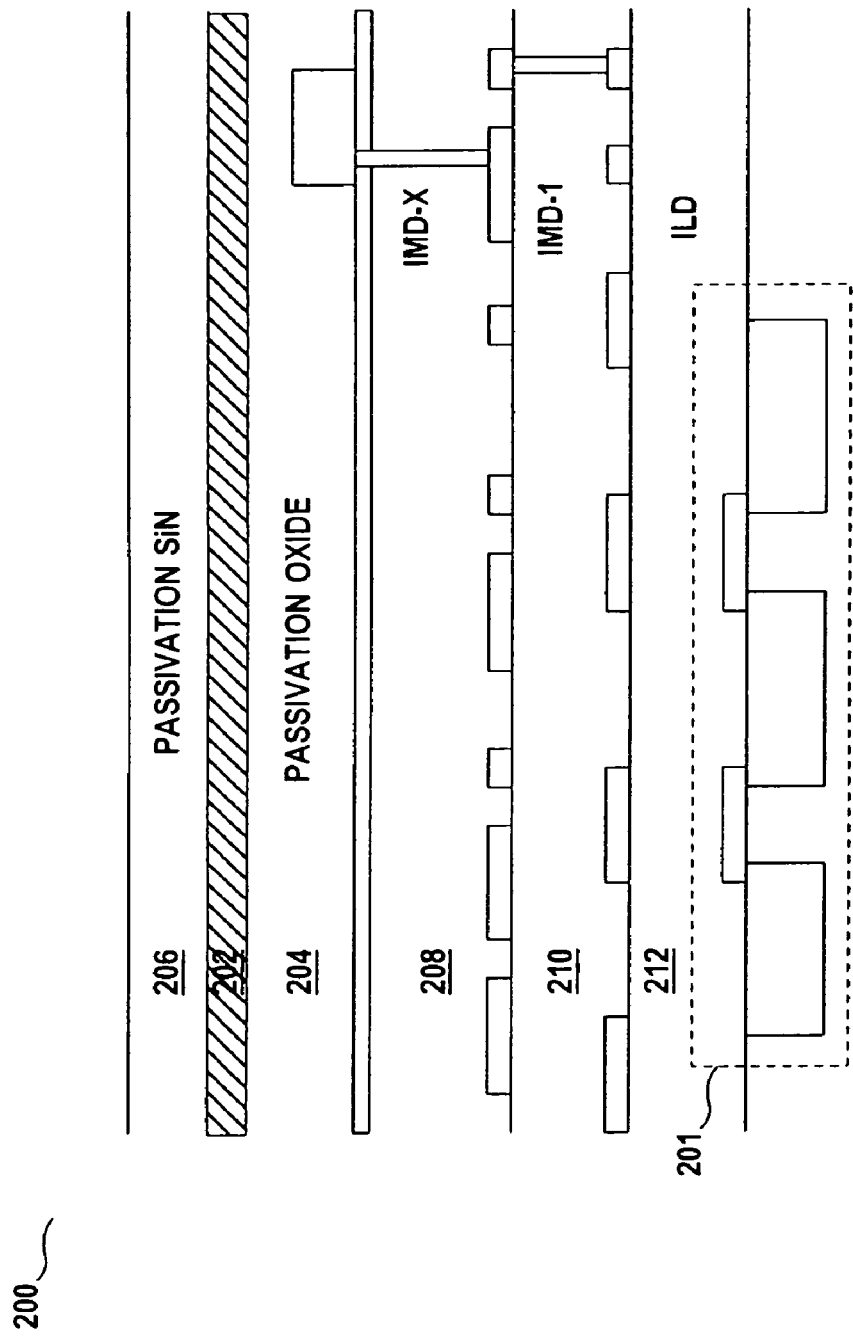
FIG. 2 illustrates a cross section of a semiconductor device with reduced leakage current fabricated by a method in accordance with one embodiment of the present invention.

FIG. 2 illustrates a cross section 200 of a semiconductor device 201 with reduced leakage current fabricated by a method in accordance with one embodiment of the present invention. The semiconductor device 201 is formed in a fashion similar to that of the semiconductor device 101 (see FIG. 1), except that a layer of hydrogen-containing layer 202 is inserted between a layer of passivation silicon oxide 204 and a layer of passivation silicon nitrite (SiN) 206. The layer of passivation oxide 204 is deposited to cover one or more layers of inter-metal dielectric 208 and 210 for providing necessary insulation. The hydrogen-containing layer 202 is deposited on the layer of passivation oxide 204. To protect the semiconductor device 201 from outside environment, the layer of passivation SiN 206 is overlaid above the hydrogen-containing layer 202. The passivation SiN 206 can provide resistance to wear and serves as a good barrier to prevent sodium ions from penetrating into the passivation oxide 204 or the hydrogen-containing layer 202. A hydrogen-forming gas annealing process is performed to drive hydrogen atoms from the hydrogen-containing layer 202 into the layers of inter-metal dielectric 208 and 210 for fixing dangling bonds therein, thereby effectively reducing the leakage current thereof.

The hydrogen-containing layer 202 is made substantially of oxide and can be formed by using technology, such as PECVD and high density plasma chemical vapor deposition (HDPCVD), low pressure chemical vapor deposition (LPCVD), atmospheric pressure chemical vapor deposition (APCVD), and spin-on coating. Besides oxide, it can also be made of materials, such as low K dielectric materials. The thickness requirement for the hydrogen-containing layer 202 can also be widely ranged from a few hundred angstroms to thousands of angstroms. In this embodiment, the thickness of the hydrogen-containing layer is between about 500 and 20,000 angstroms. The hydrogen-containing layer has a density of hydrogen between about 5 atom % and 40 atom %, such that it provides sufficient a hydrogen source during the later annealing process.

In another embodiment, the hydrogen-containing layer 202 replaces the entire layer of passivation oxide 204. In such case, no deposition of the passivation oxide 204, independent from the formation of the hydrogen-containing layer 202, is needed. The passivation SiN 206 still remains on top of the hydrogen-containing layer 202. The hydrogen-forming gas annealing process is still performed for reducing the leakage current in the inter-metal dielectric layers 208 and 201.

In another embodiment, the hydrogen-containing layer can also be inserted within the dielectric layers such as between the layers of inter-metal dielectric 210 and interlayer dielectric 212 to provide effective hydrogen penetration for the semiconductor device 201 during the hydrogen-forming gas annealing process. By implementing the extra layer of hydrogen-containing layer 202, the hydrogen-forming gas annealing process would only need to be performed once to effectively reduce the leakage current for the semiconductor device 201.

Table I provides a set of leakage current data resulted from a first stage of hydrogen annealing process:

leakage current data resulted from another set of semiconductor devices that are implemented the same type of hydrogen-containing layer (type A) with a thickness of 1000A. Similarly, tests were performed with another type of hydrogen-containing layer (type B) under two different thicknesses 500A (column 7) and 1000A (column 9). Columns 4, 6, 8, and 10 correspond to the reduction in leakage current for the data presented in columns 3, 5, 7, and 9, compared against the control test (column 2). For example, after the first stage of annealing process, the application of a type B hydrogen-containing layer with a thickness of 500A provides an 18.44% reduction in current leakage given a device size of 4.0 µm. As another example, after the second stage of annealing process, the application of a type A hydrogen-containing layer with a thickness of 1000A provides a 10.85% reduction in current leakage given a device size of 3.0 µm.

TABLE I

| | | Leakage Current Mean (mV/sec) | | | | | | |
|---|---|---|---|---|---|---|---|---|
| | Without hydrogen-containing layer | Type-A hydrogen-containing layer of 500 A thickness | | Type-A hydrogen-containing layer of 1,000 A thickness | | Type-B hydrogen-containing layer of 500 A thickness | | Type-B hydrogen-containing layer of 1,000 A thickness | |
| Size | Leakage current | Leakage current | Δ% | Leakage current | Δ% | Leakage current | Δ% | Leakage current | Δ% |
| 2.8 µm | 18.49 | 17.63 | −4.64% | 15.38 | −16.83% | 14.64 | −20.82% | 14.92 | −19.34% |
| 3.0 µm | 18.12 | 17.98 | −0.78% | 16.30 | −10.06% | 15.24 | −15.88% | 14.70 | −18.85% |
| 3.3 µm | 15.85 | 14.77 | −6.82% | 13.04 | −17.76% | 12.75 | −19.55% | 12.58 | −20.65% |
| 4.0 µm | 18.57 | 16.63 | −10.44% | 14.62 | −21.26% | 15.14 | −18.44% | 14.40 | −22.45% |

Table II provides a set of leakage current data resulted from a second stage of hydrogen annealing process:

TABLE II

| | | Leakage Current Mean (mV/sec) | | | | | | |
|---|---|---|---|---|---|---|---|---|
| | Without hydrogen-containing layer | Type-A hydrogen-containing layer of 500 A thickness | | Type-A hydrogen-containing layer of 1,000 A thickness | | Type-B hydrogen-containing layer of 500 A thickness | | Type-B hydrogen-containing layer of 1,000 A thickness | |
| Size | layer | | Δ% | | Δ% | | Δ% | | Δ% |
| 2.8 µm | 16.77 | 15.83 | −14.37% | 15.09 | −18.41% | 13.51 | −26.91% | 13.87 | −24.99% |
| 3.0 µm | 17.58 | 17.35 | −4.24% | 16.15 | −10.85% | 14.48 | −20.10% | 14.26 | −21.30% |
| 3.3 µm | 14.57 | 13.65 | −13.89% | 12.99 | −18.02% | 11.59 | −26.85% | 11.79 | −25.59% |
| 4.0 µm | 17.08 | 15.38 | −17.19% | 14.24 | −23.31% | 13.88 | −25.24% | 12.88 | −30.63% |

As shown in Tables I and II, both type A and B are hydrogen-containing layers where type B has a higher hydrogen density than that of type A. Four different device sizes (column 1) have been tested. Each semiconductor device within all size categories was tested under five different scenarios: a set of semiconductor devices not implemented with any hydrogen-containing layer (column 2: control), and the application of two different types of hydrogen-containing layer under two different thicknesses (columns 3, 5, 7, 9). For example, column 3 shows the leakage current data resulted from a set of semiconductor devices that are implemented with a predetermined type of hydrogen-containing layer (type A) that has a thickness of 500A, while column 5 shows the With the implementation of the hydrogen-containing layer, the leakage current can be reduced. The leakage current can be further reduced by repeating the hydrogen-forming gas annealing process (improvement of the results in Table II over the results in Table I).

In this invention, an additional hydrogen-containing layer film is implemented within the passivation layers. Prior to the hydrogen-forming gas annealing process, by inserting a hydrogen-containing layer film between a layer of passivation oxide and a layer of passivation nitride or directly replacing the layer of passivation oxide with hydrogen-containing layer, the passivation SiN is less likely to block hydrogen penetration, thus allowing reduction in leakage current.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A semiconductor structure with reduced leakage current, comprising:
   one or more semiconductor devices formed on a semiconductor substrate;
   one or more interlayer dielectric layers formed on the semiconductor devices, wherein the interlayer dielectric layers are disposed between the semiconductor devices and a first metal layer;
   one or more inter-metal dielectric layers formed over the interlayer dielectric layers, wherein the inter-metal dielectric layers are disposed between the first metal layer and a second metal layer overlying the first metal layer, and wherein the interlayer and inter-metal dielectric layers contain dangling bonds causing a leakage current;
   a hydrogen-containing layer formed between the layers of interlayer dielectric and inter-metal dielectric, wherein the hydrogen-containing layer has a hydrogen density in the range of about 5 atom % and about 40 atom %, substantially higher than that of the interlayer dielectric layers or inter-metal dielectric layers for providing sufficient hydrogen atoms to the interlayer and inter-metal dielectric layers during a hydrogen-forming gas annealing process to fix the dangling bonds therein; and
   a silicon nitride passivation layer formed over a silicon oxide passivation layer and the hydrogen-containing layer, wherein the hydrogen-containing layer is in direct contact with the inter-dielectric layers and the inter-metal dielectric layers.

2. The semiconductor structure of claim 1 wherein the hydrogen-containing layer is substantially made of silicon oxide formed by PECVD or HDPCVD.

3. The semiconductor structure of claim 1 wherein the hydrogen-containing layer is made of low K dielectric material.

4. The semiconductor structure of claim 1 wherein the inter-metal dielectric layers further comprising a first inter-metal dielectric layer and a second inter-metal dielectric layer.

5. The semiconductor structure of claim 1 wherein the hydrogen-forming gas annealing process comprising a first stage of hydrogen annealing.

6. The semiconductor structure of claim 5 wherein the hydrogen-forming gas annealing process further comprising a second stage of hydrogen annealing.

7. The semiconductor structure of claim 1 wherein the hydrogen-containing layer has a thickness between about 500 and about 20,000 angstroms.

8. The semiconductor structure of claim 1 wherein the hydrogen-containing layer has a density of hydrogen between about 5% and about 40%, before the hydrogen atoms are driven into the dielectric layers during the annealing process.

9. A semiconductor structure with reduced leakage current, comprising:
   one or more semiconductor devices formed on a semiconductor substrate;
   one or more interlayer dielectric layers formed on the semiconductor devices, wherein the interlayer dielectric layers are disposed between the semiconductor devices and a first metal layer;
   one or more inter-metal dielectric layers formed over the interlayer dielectric layers, wherein the inter-metal dielectric layers are disposed between the first metal layer and a second metal layer overlying the first metal layer, and wherein the interlayer and inter-metal dielectric layers contain dangling bonds causing a leakage current;
   a hydrogen-containing layer formed between the layers of interlayer dielectric and inter-metal dielectric, wherein the hydrogen-containing layer has a hydrogen density in the range of about 5 atom % and about 40 atom %, substantially higher than that of the interlayer dielectric layers or inter-metal dielectric layers for providing sufficient hydrogen atoms to the interlayer and inter-metal dielectric layers during a hydrogen-forming gas annealing process to fix the dangling bonds therein; and
   a silicon nitride passivation layer formed over the hydrogen-containing layer, wherein the hydrogen-containing layer is substantially made of silicon oxide and is in direct contact with the inter-dielectric layers and the inter-metal dielectric layers.

10. The semiconductor structure of claim 9 wherein the hydrogen-containing layer is made of low K dielectric material.

11. The semiconductor structure of claim 9 wherein the inter-metal dielectric layers further comprising a first inter-metal dielectric layer and a second inter-metal dielectric layer.

12. A semiconductor structure with reduced leakage current, comprising:
   one or more semiconductor devices formed on a semiconductor substrate;
   one or more interlayer dielectric layers formed on the semiconductor devices, wherein the interlayer dielectric layers are disposed between the semiconductor devices and a first metal laver;
   one or more inter-metal dielectric layers formed over the interlayer dielectric layers, wherein the inter-metal dielectric layers are disposed between the first metal layer and a second metal layer overlying the first metal layer, and wherein the interlayer and inter-metal dielectric layers contain dangling bonds causing a leakage current;
   a hydrogen-containing layer formed between the layers of interlayer dielectric and inter-metal dielectric, wherein the hydrogen-containing layer has a hydrogen density in the range of about 5 atom % and about 40 atom %, substantially higher than that of the interlayer dielectric layers or inter-metal dielectric layers for providing sufficient hydrogen atoms to the interlayer and inter-metal dielectric layers during a hydrogen-forming gas annealing process to fix the dangling bonds therein; and
   a silicon nitride passivation layer formed over the hydrogen-containing layer, wherein the hydrogen-containing layer is thicker than about 500 angstroms and is in direct contact with the inter-dielectric layers and the inter-metal dielectric layers.

13. The semiconductor structure of claim 12 wherein the hydrogen-forming gas annealing process further comprising a first stage of hydrogen annealing and a second stage of hydrogen annealing.

14. The semiconductor structure of claim 12 wherein the hydrogen-containing layer has a thickness between about 500 and about 20,000 angstroms.

15. The semiconductor structure of claim 12 wherein the hydrogen-containing layer has a density of hydrogen between about 5% and about 40%, before the hydrogen atoms are driven into the dielectric layers during the annealing process.

* * * * *